United States Patent
Hartner et al.

(10) Patent No.: US 6,495,415 B2
(45) Date of Patent: Dec. 17, 2002

(54) METHOD FOR FABRICATING A PATTERNED LAYER

(75) Inventors: Walter Hartner, Glen Allen, VA (US); Igor Kasko, München (DE); Volker Weinrich, Paris (FR); Frank Hintermaier, München (DE); Günther Schindler, München (DE); Hermann Wendt, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/027,532

(22) Filed: Dec. 26, 2001

(65) Prior Publication Data

US 2002/0086511 A1 Jul. 4, 2002

Related U.S. Application Data

(63) Continuation of application No. PCT/DE00/01979, filed on Jun. 20, 2000.

(30) Foreign Application Priority Data

Jun. 25, 1999 (DE) .......................................... 199 29 307

(51) Int. Cl.$^7$ .......................................... H01L 21/8242
(52) U.S. Cl. ...................... 438/250; 438/253; 438/239; 438/393; 438/396
(58) Field of Search ................................ 438/239, 253, 438/250, 393, 396

(56) References Cited

U.S. PATENT DOCUMENTS

| | | | | |
|---|---|---|---|---|
| 5,019,878 A | * | 5/1991 | Yang et al. | 257/390 |
| 5,409,862 A | | 4/1995 | Wada et al. | |
| 5,449,631 A | * | 9/1995 | Giewont et al. | 148/DIG. 19 |
| 6,091,152 A | * | 7/2000 | Iwata | 257/754 |
| 6,107,096 A | * | 8/2000 | Mikagi | 438/586 |

FOREIGN PATENT DOCUMENTS

| | | |
|---|---|---|
| DE | 197 03 205 A1 | 7/1998 |
| EP | 0 785 579 A1 | 7/1997 |
| EP | 0 859 405 A2 | 8/1998 |
| EP | 0 867 926 A1 | 9/1998 |
| EP | 0 872 880 A2 | 10/1998 |
| JP | 10 209 399 | 8/1998 |

OTHER PUBLICATIONS

Saigal et al. US 2002/0019119 A1, "High Temperature Metal Deposition For Reducing Lateral Silicidation", Feb. 14, 2002.*

* cited by examiner

Primary Examiner—John F. Niebling
Assistant Examiner—Jennifer M. Kennedy
(74) Attorney, Agent, or Firm—Laurence A. Greenberg; Werner H. Stemer; Gregory L. Mayback

(57) ABSTRACT

A method for fabricating a patterned layer from a layer material. The method includes steps of: providing a substrate with at least one target region and at least one migration region; applying a layer material; adding a material to the layer material; and performing a heat treatment such that the layer material migrates from the migration region to the target region and a layer which is self-aligned and self-patterned with respect to the target region is formed. The method has the advantage that the layer material, which can often only be etched with difficulty, does not have to be patterned directly. The desired structure of the layer is predetermined by preliminarily structuring the substrate into a target region and a migration region, and is produced by the migration of the layer material as a result of the heat treatment.

25 Claims, 7 Drawing Sheets

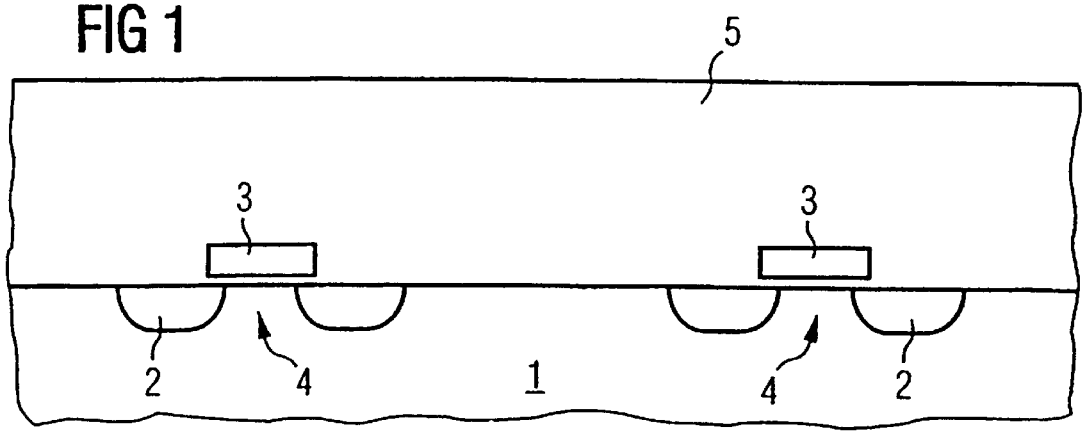
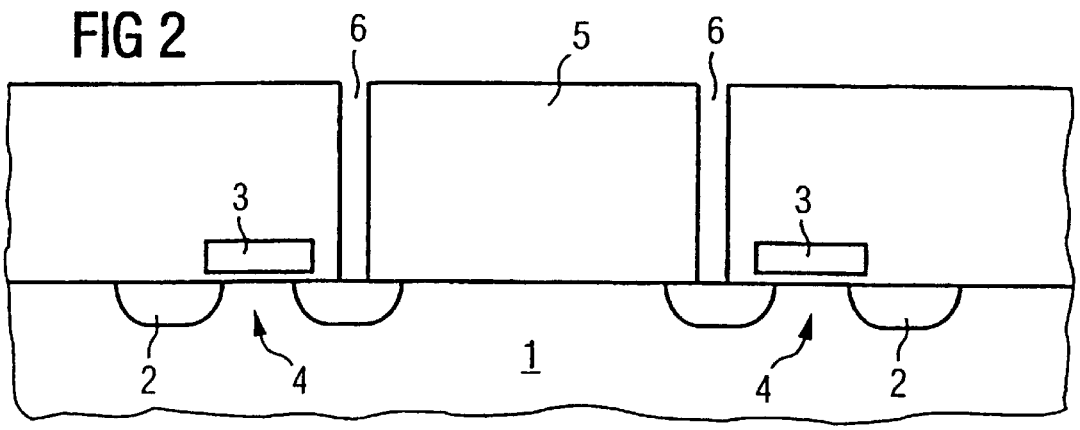
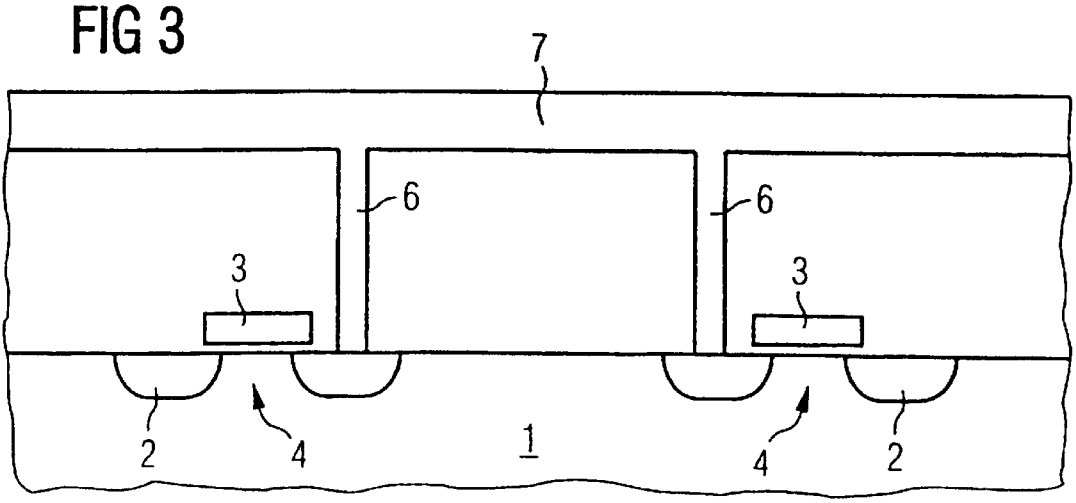

METHOD FOR FABRICATING A PATTERNED LAYER

CROSS-REFERENCE TO RELATED APPLICATION

This application is a continuation of International Application PCT/DE00/01979, filed Jun. 20, 2000, which designated the United States.

BACKGROUND OF THE INVENTION

FIELD OF THE INVENTION

The invention relates to a method for fabricating a patterned layer, and in particular, to a method for fabricating a patterned layer in an integrated circuit.

Over the last 25 years, the storage density of DRAM (Dynamic Random Access Memory) memory modules has quadrupled from one generation to the next. However, the basic design of an elemental memory cell and the materials used to construct the memory cell have remained substantially unchanged. A DRAM memory cell includes a transistor and a capacitor that stores the charge required to represent the information, just as it did 25 years ago. The capacitor of the memory cell has electrodes made from doped silicon or polysilicon and a dielectric layer made of silicon dioxide and/or silicon nitride that is arranged between the electrodes.

To be able to reproducibly read the charge stored in a capacitor, the capacitance of the capacitor should be at least approximately 30 fF. At the same time, it has been necessary, and remains necessary, to constantly reduce the lateral extent of the capacitor, in order to be able to achieve the abovementioned increase in the storage density. These inherently contradictory demands imposed on the capacitor of the memory cell have led and continue to led to increasingly complex structuring of the capacitor ("trench capacitors", "stack capacitors", "crown-shaped capacitors"), in order to be able to provide a sufficiently large capacitor surface despite the continually decreasing lateral extent of the capacitor. However, this makes fabrication of the capacitor increasingly complex and therefore increasingly expensive.

A further way of achieving a capacitor with a sufficient capacitance is to use different materials between the capacitor electrodes. Therefore, in recent times new materials, in particular paraelectrics and ferroelectrics, have been used between the capacitor electrodes of a memory cell instead of the conventional silicon oxide/silicon nitride. These new materials have a considerably higher relative dielectric constant (>20) than the conventional silicon oxide/silicon nitride (<8). Therefore, when these materials are used to obtain the same capacitance in a memory cell with same lateral extent, the capacitor area required and therefore the complexity of the patterning of the capacitor required can be reduced considerably. By way of example, barium strontium titanate (BST, (Ba, Sr) TiO$_3$), lead zirconate titanate (PZT, Pb(Zr, Ti) O$_3$) or lanthanum-doped lead zirconate titanate, or strontium bismuth tantalate (SBT, SrBi$_2$Ta$_2$O$_9$) are used.

In addition to conventional DRAM memory modules, ferroelectric random access memories, known as FRAMs, will play an important role in the future. Compared to conventional memory arrangements, such as for example, DRAMs and SRAMs (Static Random Access Memories), ferroelectric memory arrangements have the advantage that the stored information is not lost even when the voltage or current supply is interrupted, but rather remains stored. This non volatile state of ferroelectric memory arrangements is based on the fact that, when using ferroelectric materials, the polarization which is applied using an external electric field is substantially retained even after the external electric field has been disconnected. The abovementioned new materials, such as barium strontium titanate (BST, (Ba, Sr) TiO$_3$), lead zirconate titanate (PZT, Pb(Zr, Ti)O$_3$) or lanthanum-doped lead zirconate titanate, or strontium bismuth tantalate (SBT, SrBi$_2$Ta$_2$O$_9$) are also used for ferroelectric memory arrangements.

Unfortunately, when these new paraelectrics or ferroelectrics are used, new electrode materials must also be used. The new paraelectrics or ferroelectrics are usually deposited on electrodes that are already present (bottom electrodes). The processing takes place at high temperatures, and at these temperatures, the materials which usually make up the capacitor electrodes, for example doped polysilicon, are readily oxidized and lose their electrically conductive properties, which would lead to a failure of the memory cell.

Because of their good resistance to oxidation and/or the formation of electrically conductive oxides, 4d and 5d transition metals, in particular platinum metals (Ru, Rh, Pd, Os, Ir, Pt), and in particular platinum itself, appear to be promising candidates that could replace doped silicon/polysilicon as the electrode material.

Unfortunately, it has been found that the abovementioned materials, which are now being employed in integrated circuits, are very difficult or even impossible to etch chemically. The material that is removed by etching, even when using "reactive" gases, is attributable predominately or almost exclusively to the physical component of the etching.

Patterning of the materials used hitherto has generally been carried out with plasma-assisted anisotropic etching methods. In this case, physical-chemical methods are employed, in which gas mixtures including one or more reactive gases, such as for example, oxygen, chlorine, bromine, hydrogen chloride, hydrogen bromide or halogenated hydrocarbons and inert gases (e.g. Ar, He) are used. These gas mixtures are generally excited in an alternating electromagnetic field at low pressures, with the result that the gas mixture is converted into a plasma.

The positive ions of the plasma then impinge virtually perpendicularly on the layer that is to be patterned, allowing good reproduction of a mask resting on the layer that is to be patterned. Photoresists are usually used as the mask materials, since they can be patterned relatively easily by means of an exposure step and a development step. The physical component of the etching is effected by the pulsed and kinetic energy of the impinging ions (e.g. Cl2+, Ar+). In this way, chemical reactions between the layer that is to be patterned and the reactive gas particles (ions, molecules, atoms, radicals) leading to the formation of volatile reaction products, are initiated or enhanced (chemical component of the etching). These chemical reactions between the substrate particles and the gas particles are responsible for the high etching selectivity of the etching process.

Since the chemical component is small or even absent when etching the above materials, in particular, when etching the electrode material, the amount of material removed from the layer to be patterned by etching is of the same order of magnitude as the amount of material removed from the mask or the underlying layer (etching stop layer). Thus, the etching selectivity with respect to the etching mask or the underlying layer is generally low (between approximately 0.3 and 3.0). Consequently, the erosion of masks with inclined flanks and the inevitable formation of bevels on the masks means that the patterning will have a low-dimensional accuracy. Furthermore, particularly when carrying out an overetching step, the underlying layer is etched to a considerable extent, and the result is sloping etched flanks which are very difficult to control. Consequently, very small electrodes (basic surface area of the electrode=F2, F=smallest feature size which can be fabricated using a defined technique) can only be produced with considerable effort.

To improve or avoid the etching of layer materials that are difficult to etch, Published European Patent Application EP 859 405 A2, Published European Patent Application EP 867 926 A1, and Published German Patent Application DE 197 03 205 A1 describe methods in which raised capacitor electrodes, selective silicide regions or combined precious metal/non-precious metal structures are formed.

SUMMARY OF THE INVENTION

It is accordingly an object of the invention to provide a method for fabricating a patterned layer in which the above-mentioned problems with occur in the physical-chemical etching processes are considerably reduced or avoided altogether.

With the foregoing and other objects in view there is provided, in accordance with the invention, a method for fabricating a patterned layer from a layer material. The method includes steps of: a) providing a substrate with at least one target region and at least one migration region; b) applying a layer material; c) adding a material selected from the group consisting of Ti, TiN, Ta, TaN, W, WN, Bi, $BiO_x$, Ir, $IrO_x$, $IrHfO_x$, Ru, $RuO_x$, Pd, and $PdO_x$ to the layer material; and d) performing a heat treatment such that the layer material migrates from the migration region to the target region and a layer which is self-aligned and self-patterned with respect to the target region is formed.

The method has the advantage that the layer material, which can often only be etched with difficulty, does not have to be patterned directly. The desired structure of the layer is predetermined by preliminarily structuring the substrate into a target region and a migration region, and is produced by the migration of the layer material as a result of the heat treatment, in a self-organization process. Consequently, direct etching of the layer material, with all the abovementioned problems, can be avoided.

The surface of the migration region is such that, under identical conditions, the layer material has a higher mobility at the migration region than at the target region. This ensures that the layer material flows from the migration region to the target region during the heat treatment. The surface of the migration region has somewhat unfavorable properties with regard to wetting by the layer material or with regard to its adhesion. By contrast, the target region enables good wetting and adhesion of the layer material in that region. As a result of the preliminary structuring of the substrate into a target region and a migration region, a layer consisting of the layer material which is self-aligned and self-patterned with respect to the target region is formed.

If the method is used for fabricating an electrode, for example, for a storage capacitor, the method also has the advantage that the electrode can be selected to be as small as its connection. If the connection, usually a plug with a barrier, for the electrode of a stack capacitor is fabricated with the smallest feature size F2 that can be fabricated with conventional fabrication methods, the basic surface area of the electrode has to be selected to be considerably greater than F2 to ensure an overlap between the electrode and the barrier. If, with the conventional fabrication methods, the basic surface area of the electrode were not selected to be significantly larger than F2, inaccuracies in the alignment of the corresponding masks could lead to no overlap between the electrode and the barrier. This would lead to an unconnected electrode, which would lead to a failure of the memory cell. Accordingly, memory cells in which a stack capacitor is used require relatively large amounts of space, which has an adverse effect on the storage density that can be achieved.

In the method, the connections can be used as target regions and the insulating layer which lies between the connections can be used as the migration region. Accordingly, the electrodes are formed, as part of the layer to be patterned, in a self-aligned manner on the connections (target regions) so that a sufficient overlap between the electrodes and their connections is automatically ensured. There is no need to undesirably enlarge the electrode, which is necessary in the prior art to compensate for positional errors. Accordingly, the space required by the electrode can be reduced.

Since the preliminary structuring of the substrate is used to define the structure of the layer that will be patterned, for example, for fabricating the connections of the memory cell, it is also possible to save one mask level. The different masks that are used in the prior art to produce the connections and to produce the electrodes can be combined to form a single mask so that the fabrication costs can be reduced considerably.

In accordance with an added feature of the invention, in step b), the layer material is applied as a thin film. This has the advantage that existing processes can be used to apply the layer material without requiring significant changes to the process parameters. Furthermore, it is preferable if the layer of the thin film has a thickness of less than 100 nm, preferably less than 50 nm. The atoms or molecules of the layer material then have sufficient mobility, so that the migration of the layer material is concluded within a relatively short time. If it is desirable to produce patterned layers of relatively great thickness, it is preferable if steps b) and c) are repeated, to produce a patterned layer of a predetermined thickness.

The layer thickness of the applied layer material should preferably be selected so that it is possible for the layer material to migrate to the target region. If the layer thickness is excessive, the migration may be impaired.

In accordance with an additional feature of the invention, the heat treatment is carried out at a temperature of more than 550° C., preferably more than 600° C. Furthermore, it is preferable if the heat treatment is carried out in an oxygen, nitrogen or argon atmosphere.

In accordance with another feature of the invention, the layer material is deposited over the entire surface by sputtering. Furthermore, it is preferred if the sputtering temperature is over 500° C.

In accordance with a further feature of the invention, the migration region contains $SiO_2$, $Si_3N_4$, $Al_2O_3$, AlN, BN, MgO, $La_2O_3$, LaN, $Y_2O_3$, YN, $Sc_2O_3$, ScN, $TiO_2$, $Ta_2O_3$ or an oxide of the lanthanides, and/or the target region contains Pt, Pd, Rh, Ir, Ru, Os, Re or their conductive oxides or silicides, Cu, Ag, Au, Ni, Si, or a transition metal or a silicide of the transition metals. Furthermore, it is preferred if a metal of the 4d and 5d transition metals, in particular a platinum metal, in particular platinum, or rhenium is used as the layer material.

In accordance with a further added feature of the invention, Ti, TiN, Ta, TaN, W, WN, Bi, $BiO_x$, Ir, $IrO_x$, $IrHfO_x$, Ru, $RuO_x$, Pd and/or $Pdo_x$ is added to the layer material prior to step c). In a preferred configuration, this takes place by applying a layer that contains these materials to the layer material and performing a heat treatment so that the materials diffuse into the layer material. The addition of the materials increases the mobility of the atoms or molecules of the layer material, so that the migration of the layer material is completed within a relatively short time.

In accordance with a further additional feature of the invention, the following steps are carried out in step a) to provide the substrate that has at least one target region and at least one migration region: a substrate including the material of the migration region is provided; the material of the target region is applied; and the material of the target region is patterned so that at least one target region and at least one migration region are produced.

The patterning of the material of the target region may in this case take place by using a photographic technique with subsequent etching or by using a damascene technique.

In accordance with yet an added feature of the invention, in step a), the following steps are carried out to provide the substrate that has at least one target region and at least one migration region: a substrate is provided; the material of the target region is applied; the material of the target region is patterned; the material of the migration region is applied; and a planarization step is carried out so that at least one target region and at least one migration region are produced.

In this case, it is preferred if the material of the target region is deposited as a layer and the material of the target region is patterned using a hard mask. Preferred materials for the hard mask are titanium nitride, titanium oxide or silicon oxide. Using a hard mask generally results in rounded edges during the patterning of the material of the target region. The structures that are produced in this way have a smaller lateral extent on their top side than on their underside. If the area around these structures is then filled with the material of the migration region, target regions with a lateral extent that is smaller than that which could be produced directly with the lithography employed are produced on the surface.

In accordance with a concomitant feature of the invention, the material of the migration region is also deposited as a layer.

It is particularly preferred if a CMP step is carried out as the planarization step.

Other features which are considered as characteristic for the invention are set forth in the appended claims.

Although the invention is illustrated and described herein as embodied in method for fabricating a patterned layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 8 show a substrate during various stages of a first method for fabricating a patterned layer;

DESCRIPTION OF THE PREFERRED EMBODIMENTS

Figure 4:
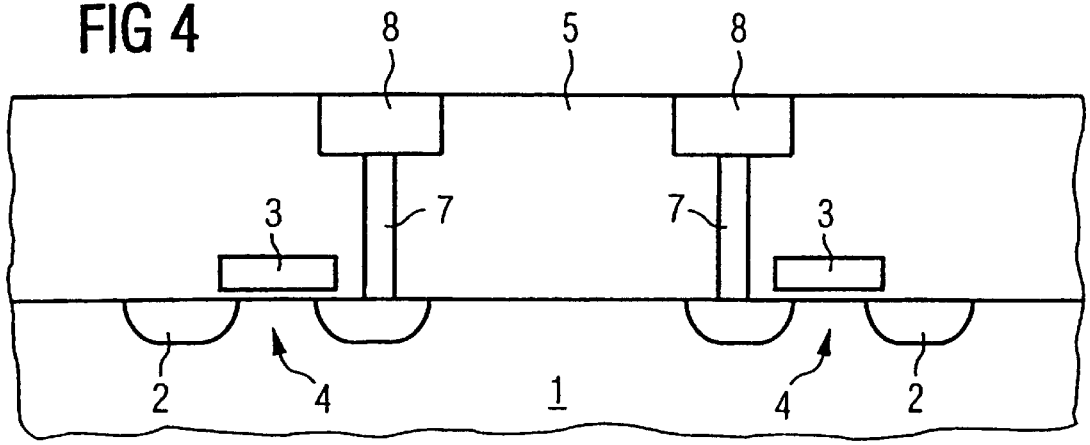

Referring now to the figures of the drawing in detail and first, particularly, to FIG. 1 thereof, there is shown a silicon substrate 1 with selection transistors 4 which have already been produced. The selection transistors 4 each have two diffusion regions 2 which are arranged on the surface of the silicon substrate 1. A gate electrode 3 is located on the surface of the silicon substrate 1. The channel zone, which is separated from the gate electrode 3 by the gate oxide, is arranged between the diffusion regions 2 of a selection transistor 4. These selection transistors 4 are fabricated using prior art methods and are not explained in more detail in the present description. An insulating layer 5, for example, an $SiO_2$ layer, is applied to the silicon substrate 1 with the selection transistors 4. Depending on the method used for fabricating the selection transistors 4, it is also possible for a plurality of insulating layers to be applied. The resulting structure is shown in FIG. 1.

Then, a photographic technique is used to produce contact holes 6. This is carried out, for example, with an anisotropic etching step using fluorine-containing gases. The resulting structure is shown in FIG. 2.

Then, a conductive material 7, for example polysilicon doped in situ, is applied to the structure. This can take place, for example, by means of a CVD method. The applied conductive material 7 completely fills up the contact holes 6, and a cohesive conductive layer is formed on the top side of the silicon substrate 1 (FIG. 3). A CMP (Chemical Mechanical Polishing) step then follows, which removes the cohesive conductive layer at the top side of the silicon substrate 1 and produces a planar surface.

Next, recesses are formed in the insulating layer 5, and these recesses overlap the contact holes 6. These recesses are then filled with barrier material 8, for example, iridium oxide. This is achieved by depositing the barrier material 8 over the entire surface and then carrying out another CMP step. The resulting structure is shown in FIG. 4.

As a result, the first step a) of the method according to the invention is concluded. A substrate 1 is provided that has target regions, formed by the barriers 8, and that has a migration region, formed by the insulating layer 5.

Electrode material in the form of a platinum thin film 9 with a thickness of 40 nm is then deposited over the entire surface. The platinum layer 9 is applied using a sputtering method with a sputtering temperature of approximately 550° C.

Figure 5:
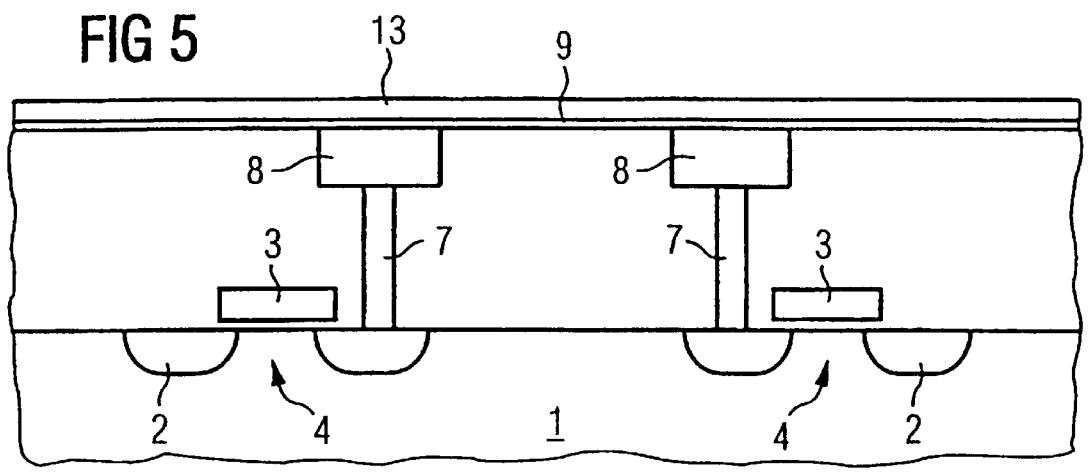

Then, a bismuth oxide layer 13 is applied to the thin platinum layer 9, for example, using a CVD method, and a heat treatment step is carried out at a temperature of approximately 500° C. The heat treatment causes some of the bismuth atoms to diffuse out of the bismuth oxide layer 13 into the platinum thin film 9. The proportion of bismuth atoms in the platinum layer is then between 1 and 10% by volume. The resulting structure is shown in FIG. 5.

Figure 6:
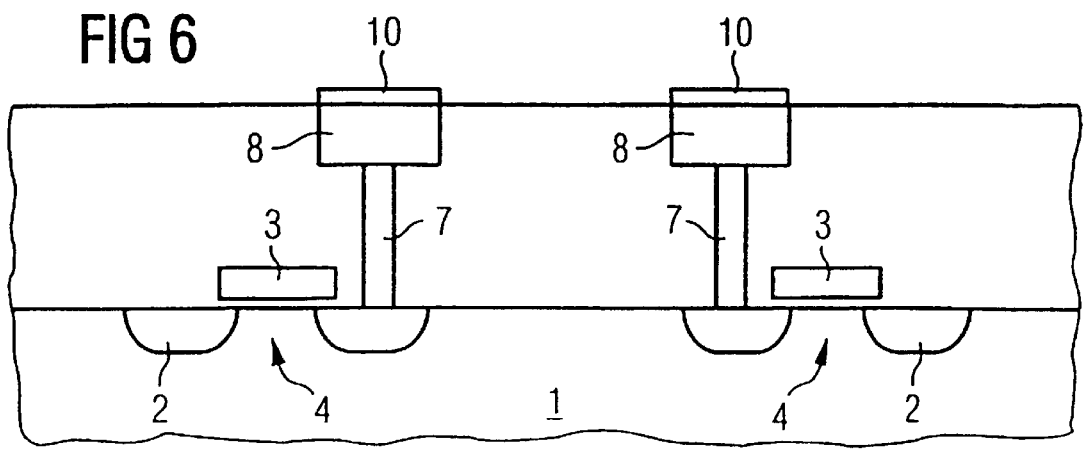

Then, an etching step is performed to selectively remove the bismuth oxide layer 13 with respect to the platinum layer 9, and a further heat treatment is carried out at a temperature of approximately 700° C. in an oxygen atmosphere. The heat treatment leads to migration of the platinum, with the result that a patterned platinum layer is produced in a self-organization step, i.e. in particular, the platinum electrodes 10 are produced in a self-aligned manner with respect to the barriers 8. The mobility of the platinum atoms is increased by the added bismuth atoms. The platinum atoms migrate from the migration region, specifically the insulating layer 5, to the target regions, specifically the barriers 8, since in this way the free energy of the system can be reduced. As a result, self-aligned platinum structures can be produced without performing an additional etching step. The resulting structure is shown in FIG. 6.

Figure 7:
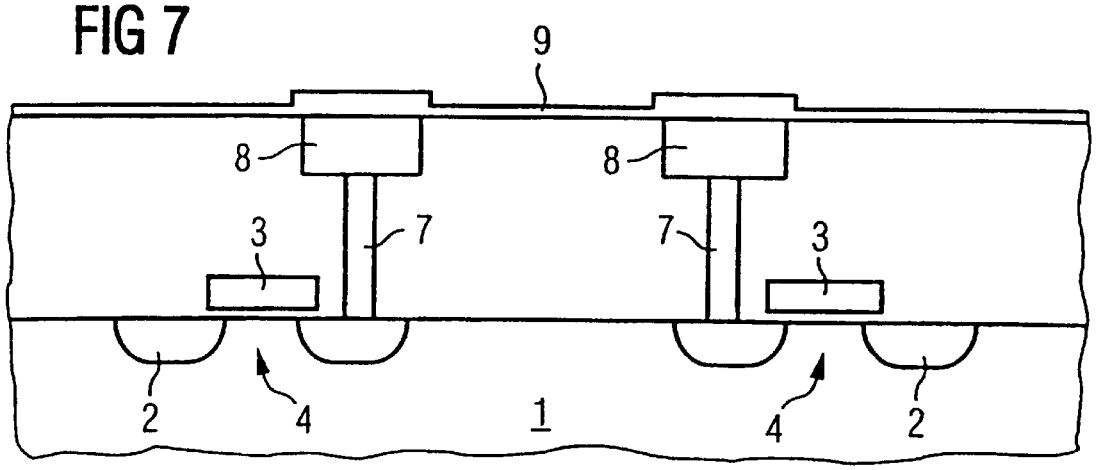

To increase the height of the platinum electrodes 10, a thin film 9 of platinum is deposited once again by sputtering at a temperature of approximately 550° C. It is optionally possible for a bismuth oxide layer to be applied again. The resulting structure is shown in FIG. 7.

Figure 8:
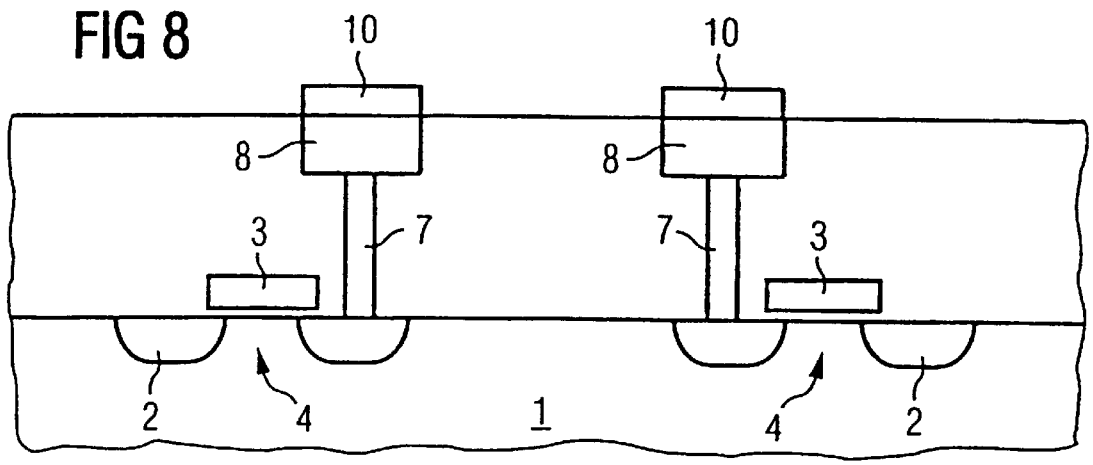

Subsequently, a heat treatment step is performed at a temperature of approximately 700° C. in an oxygen atmosphere. The platinum atoms that have additionally been applied migrate out of the migration region to the target regions, so that it is possible to produce electrodes of a predetermined thickness. The resulting structure is shown in FIG. 8.

A dielectric and/or ferroelectric layer is subsequently produced and a further layer is deposited to form the upper electrode (not shown). These layers are then usually patterned together, so that each of the memory cells include a completed selection transistor 4 and a capacitor.

Figure 9:
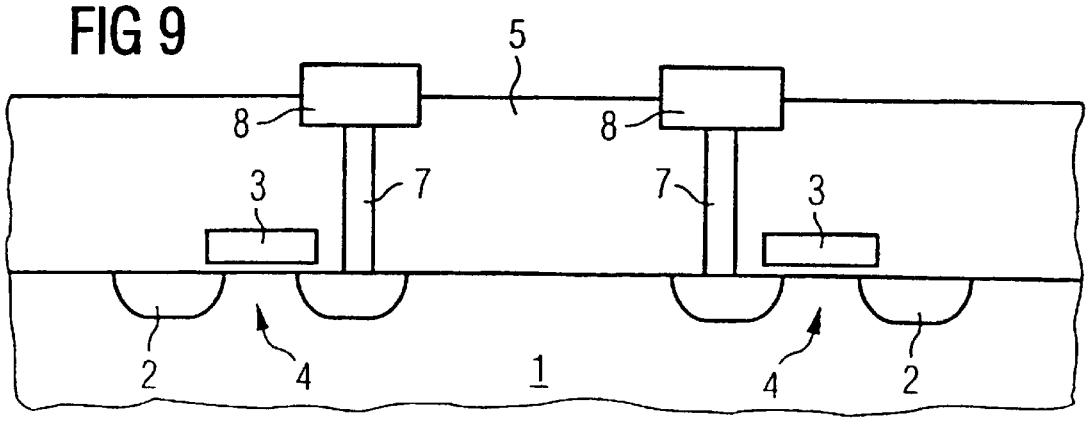
FIGS. 9 and 10 show a substrate during various stages of a second method for fabricating a patterned layer.
Figure 10:
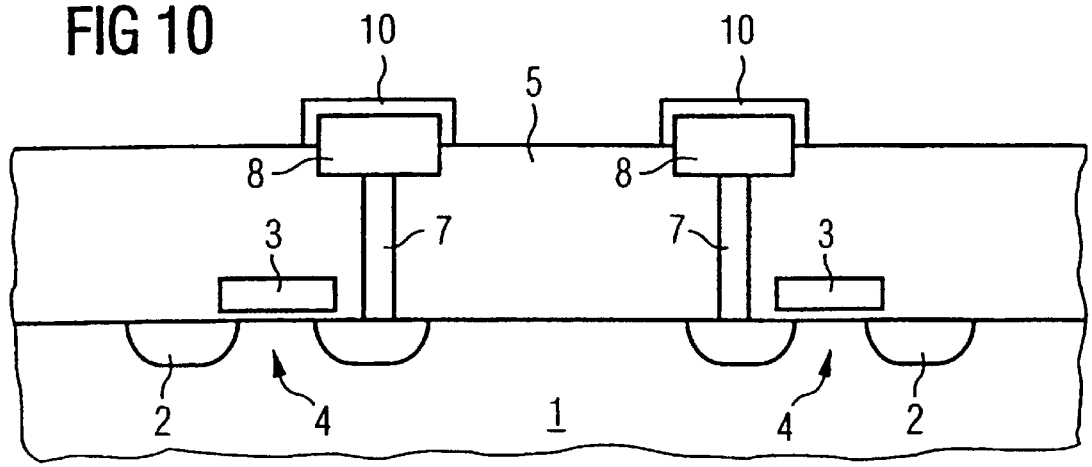
Figure 11:
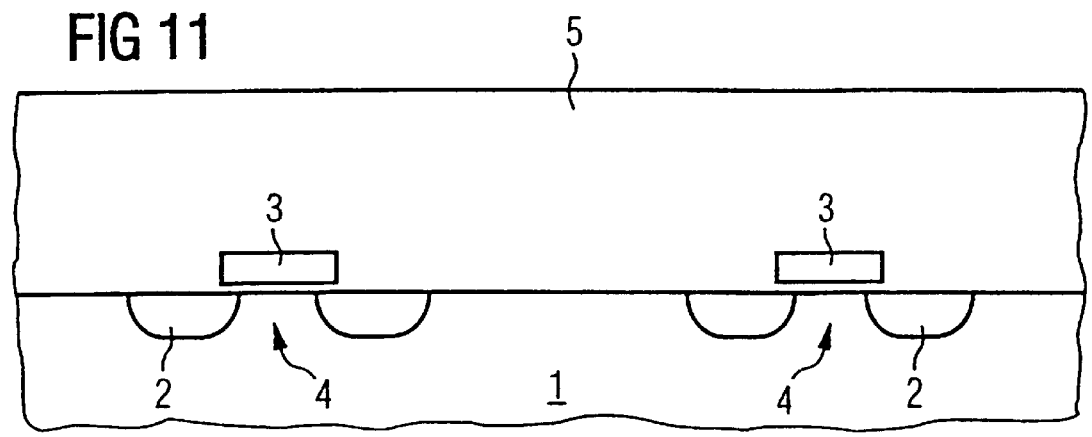
FIGS. 11 to 16 show a substrate during various stages of a third method for fabricating a patterned layer.

FIGS. 9 and 10 show a second embodiment of the method for fabricating a patterned layer.

The first steps of this second embodiment corresponds to the steps that have been explained in connection with FIGS. 1 to 4. Therefore, these steps are not explained again. Starting from the situation shown in FIG. 4, the insulating layer 5 is etched back selectively with respect to the barrier, resulting in the situation shown in FIG. 9.

As a result, the first step a) of the second embodiment of the invention is concluded. A substrate 1 that has target regions, specifically the barriers 8, and a migration region, specifically the insulating layer 5, has been provided.

Subsequently electrode material is deposited over the entire surface. The electrode material is a platinum thin film with a thickness of 40 nm. The platinum thin film is applied using a sputtering method with a sputtering temperature of approximately 550° C. Then, a bismuth oxide layer 13 is applied to the platinum thin film, for example, using a CVD method, and a heat treatment is carried out at a temperature of approximately 500° C. The heat treatment causes some of the bismuth atoms to diffuse out of the bismuth oxide layer into the platinum thin film.

Then, the bismuth oxide layer is selectively removed with respect to the platinum layer by etching, and a further heat treatment is performed at a temperature of approximately 700° C. in an oxygen atmosphere. The heat treatment leads to migration of the platinum, which results in the production of a patterned platinum layer in a self-organization process, i.e. in particular, the platinum electrodes 10 are produced in a self-aligned manner with respect to the barriers 8. The mobility of the platinum atoms is increased by the bismuth atoms that have been added. The platinum atoms migrate from the migration region, specifically the insulating 5, to the target regions, specifically the barriers 8, since the free energy of the system can be reduced as a result. The resulting situation is shown in FIG. 10.

The embodiment shown in FIG. 10 has the advantage that at least part of the side walls of the barrier 8 can also be used as capacitor surfaces, which increases the capacitor surface area for substantially the same lateral extent of the capacitor.

FIGS. 11 to 16 show a third embodiment of the method for fabricating a patterned layer.

FIG. 11 once again shows a silicon substrate 1 in which selection transistors 4 have already been produced. The selection transistors 4 each have two diffusion regions 2 that are arranged at the surface of the silicon substrate 1. A gate electrode 3 is located on the surface of the silicon substrate 1. The channel zone, which is separated from the gate electrode 3 by the gate oxide, is arranged between the diffusion regions 2 of a selection transistor 4. These selection transistors 4 are fabricated using prior art methods and will not be explained in more detail in the present description. An insulating layer 5, for example, an SiO2 layer, is applied to the silicon substrate with the selection transistors 4. Depending on the method used for fabricating the selection transistors 4, it is also possible for a plurality of insulating layers to be applied.

Figure 12:
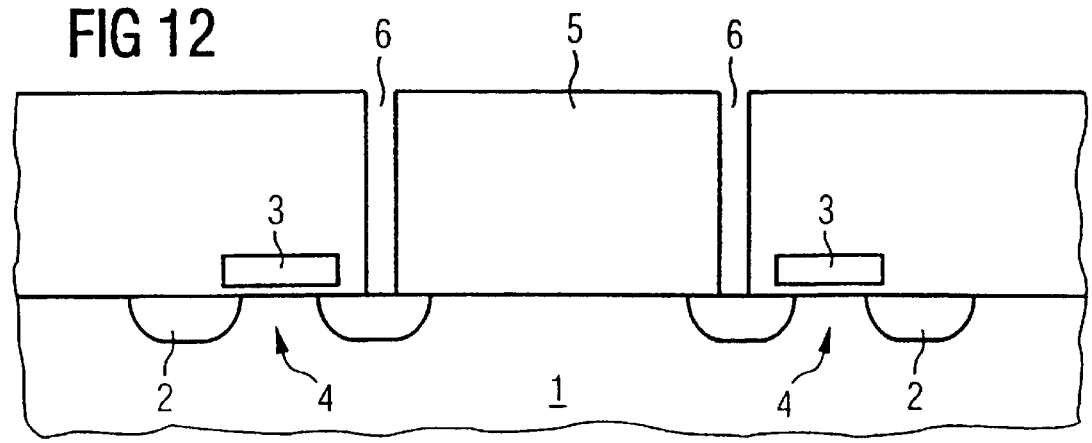

Then, a photographic technique is used to produce the contact holes 6. This is achieved, for example, by anisotropic etching using fluorine-containing gases. The resulting structure is shown in FIG. 12.

A conductive material 7, for example, polysilicon doped in situ, is then applied to the structure. This can be achieved, for example, using a CVD method. The conductive material 7 is applied to completely fill up the contact holes 6, and a cohesive conductive layer is formed on the top side of the silicon substrate 1. A CMP (Chemical Mechanical Polishing) step then follows, which removes the cohesive conductive layer at the top side of the silicon substrate 1 and produces a planar surface.

Figure 13:
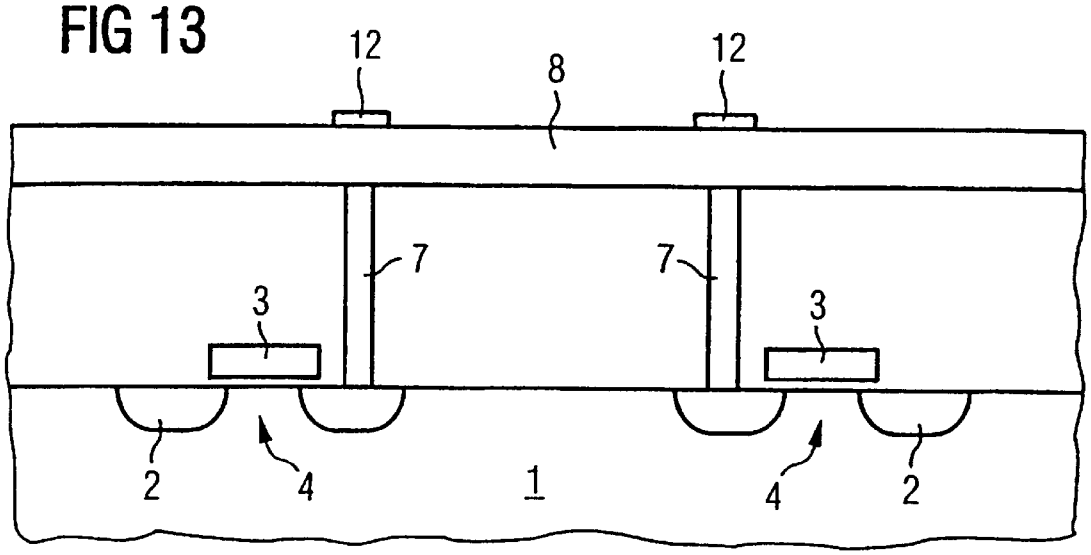

Next, the barrier material 8, for example, iridium oxide, is deposited over the entire surface and a TiN hard mask 12 is produced on the barrier layer 8 for the purpose of patterning of the barrier layer 8. The resulting structure is shown in FIG. 13.

Figure 14:
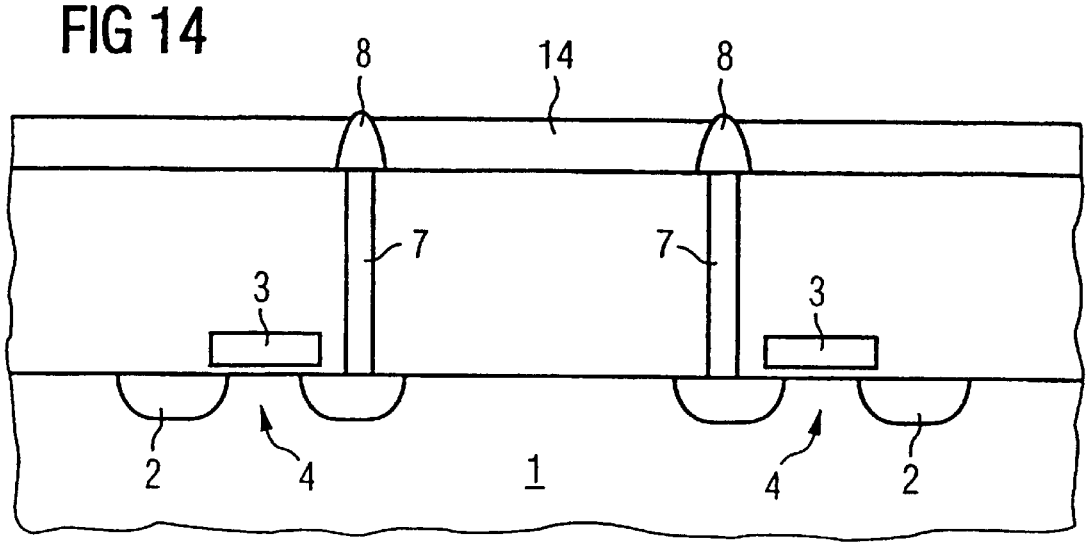

Using the TiN hard mask 12 during the patterning of the S barrier layer 8 results in rounded edges. Consequently, the structures produced in this way have a top side with a smaller lateral extent than their underside. Then, a further SiO$_2$ layer 14 is deposited and a CMP step is performed. In this way, the region around the barriers 8 is filled with silicon oxide, and barriers 8, with a lateral extent that is smaller than that which could be produced directly with the lithography method employed, are formed at the surface. The resulting structure is shown in FIG. 14.

This concludes the first step a) of the third embodiment of the method. A substrate having target regions, specifically the barriers 8, and a migration region, specifically the insulating layer 14, has been provided.

Figure 15:
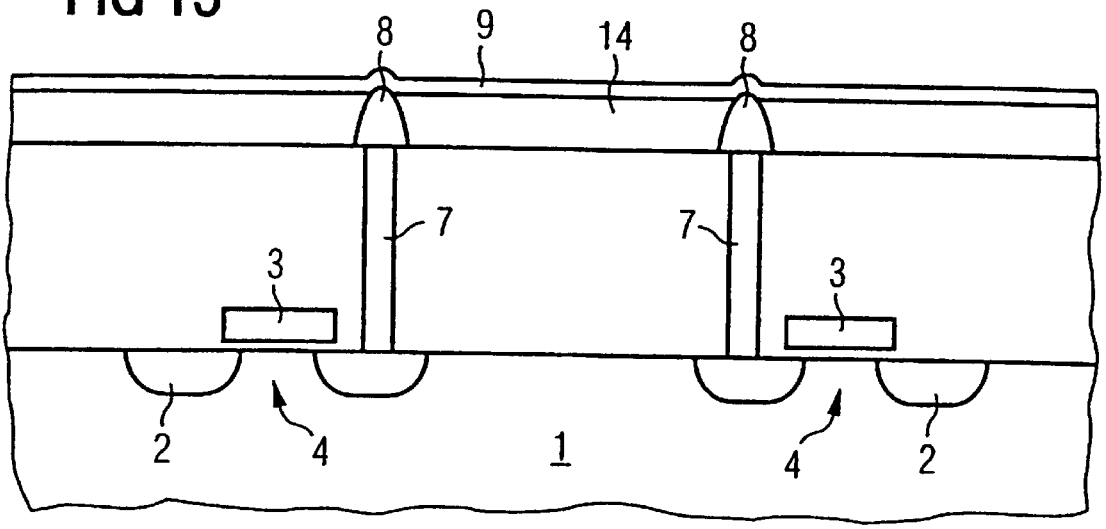
Figure 16:
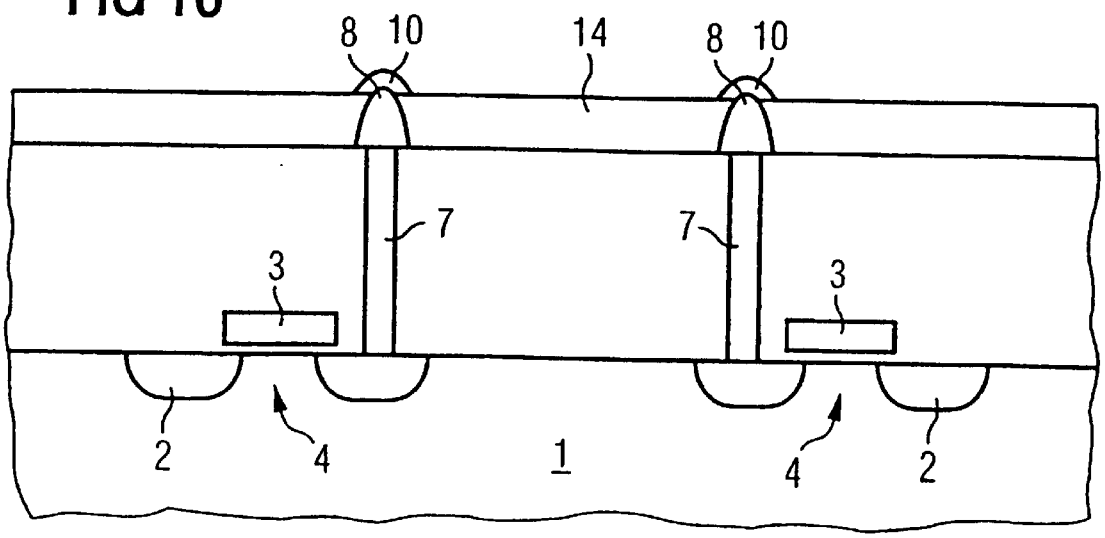

Subsequently, electrode material in the form of a platinum thin film 9 with a thickness of 40 nm is deposited over the entire surface. The platinum layer 9 is applied using a sputtering method with a sputtering temperature of approximately 550° C. (FIG. 15). Then, a bismuth oxide layer (not shown) is applied to the platinum thin film 9, for example, using a CVD method, and a heat treatment is carried out at a temperature of approximately 500° C. The heat treatment causes some of the bismuth atoms to diffuse out of the bismuth oxide layer into the platinum thin film 9. The proportion of bismuth atoms in the platinum layer is then between 1 and 10% by volume. Then, the bismuth oxide layer is selectively removed with respect to the platinum layer 9 using an etching operation, and a further heat treatment is performed at a temperature of approximately 700° C. in an oxygen atmosphere. The heat treatment leads to migration of the platinum, with the result that a patterned platinum layer is produced in a self-organization process, i.e. in particular, the platinum electrodes 10 are produced in a self-aligned manner with respect to the barriers 8. The mobility of the platinum atoms is increased by the added bismuth atoms. The resulting structure is shown in FIG. 16.

This is followed by producing a dielectric and/or ferroelectric layer and by depositing a further layer for forming the upper electrode (not shown). These layers are then usually patterned together to complete the memory cells which each include a selection transistor 4 and a capacitor.

In a further embodiment of the present invention, it is possible to dispense with the step of depositing the further $SiO_2$ layer 14, which is shown in FIG. 14. The result is a situation which is similar to the situation shown in FIG. 9.

Figure 17:
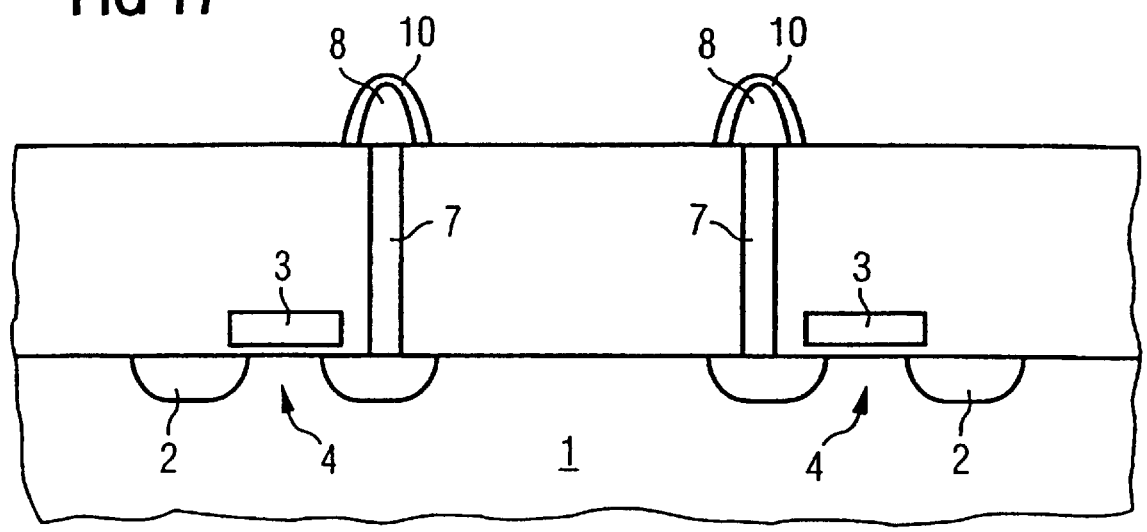
FIG. 17 shows a substrate with increased capacitor surfaces.

The configuration shown in FIG. 17 can then be produced by performing the steps of platinum deposition and a subsequent heat treatment which have already been explained.

The embodiment shown in FIG. 17 has the advantage that the side walls of the barrier 8 can also be used as capacitor surfaces, resulting in an increased capacitor surface area for a capacitor with substantially the same lateral extent.

We claim:

1. A method for fabricating a patterned layer from a layer material, which comprises:
   a) providing a substrate with at least one target region and at least one migration region;
   b) applying a layer material;
   c) adding a material selected from the group consisting of Ti, TiN, Ta, TaN, W, WN, Bi, $BiO_x$, Ir, $IrO_x$, $IrHfO_x$, Ru, $RuO_x$, Pd, and $PdO_x$ to the layer material; and
   d) performing a heat treatment such that the layer material migrates from the migration region to the target region and a layer which is self-aligned and self-patterned with respect to the target region is formed.

2. The method according to claim 1, which comprises performing step b) such that the layer material is applied as a thin film.

3. The method according to claim 2, which comprises performing step b) such that the film has a thickness of less than 100 nm.

4. The method according to claim 2, which comprises performing step b) such that the film has a thickness of less than 50 nm.

5. The method according to claim 1, which comprises performing the heat treatment at a temperature of more than 550° C.

6. The method according to claim 1, which comprises performing the heat treatment at a temperature of more than 600° C.

7. The method according to claim 1, which comprises performing the heat treatment in an atmosphere selected from the group consisting of an oxygen atmosphere, a nitrogen atmosphere, and an argon atmosphere.

8. The method according to claim 1, wherein:
   the substrate has a surface; and
   step b) includes sputtering the layer material over all of the surface.

9. The method according to claim 8, which comprises performing the sputtering at a sputtering temperature of over 500° C.

10. The method according to claim 1, wherein the migration region includes a material selected from the group consisting of $SiO_2$, $Si_3N_4$, $Al_2O_3$, AlN, BN, MgO, $La_2O_3$, LaN, $Y_2O_3$, YN, $Sc_2O_3$, ScN, $TiO_2$, $Ta_2O_3$, and an oxide of a lanthanide.

11. The method according to claim 1, wherein the target region includes a material selected from the group consisting of Pt, Pd, Rh, Ir, Ru, Os, Re, Cu, Ag, Au, Ni, Si, a conductive oxide of a material selected from the group consisting of Pt, Pd, Rh, Ir, Ru, Os, and Re, and a silicide of a material selected from the group consisting of Pt, Pd, Rh, Ir, Ru, Os, and Re.

12. The method according to claim 1, wherein the target region includes a material selected from the group consisting of a transition metal and a silicide of a transition metal.

13. The method according to claim 1, which comprises using a metal selected from the group consisting of a 4d transition metal and a 5d transition metal as the layer material that is applied in step b).

14. The method according to claim 1, which comprises using a platinum metal as the layer material that is applied in step b).

15. The method according to claim 1, which comprises using a metal selected from the group consisting of platinum and rhenium as the layer material that is applied in step b).

16. The method according to claim 1, wherein step c) includes:
   applying to the layer material, a layer of the material that is selected from the group consisting of the Ti, the TiN, the Ta, the TaN, the W, the WN, the Bi, the $BiO_x$, the Ir, the $IrO_x$, the $IrHfO_x$, the Ru, the $RuO_x$, the Pd, and the $PdO_x$; and
   performing a heat treatment so that the material that is selected from the group consisting of the Ti, the TiN, the Ta, the TaN, the W, the WN, the Bi, the $BiO_x$, the Ir, the $IrO_x$, the $IrHfO_x$, the Ru, the $RuO_x$, the Pd, and the $PdO_x$ diffuses into the layer material.

17. The method according to claim 1, wherein step a) includes:
   forming the substrate from a material that will also form the migration region;
   applying a material that will form the target region; and
   patterning the material that will form the target region to produce the target region and the migration region.

18. The method according to claim 17, wherein the step of applying the material that will form the target region includes depositing a layer of the material that will form the target region.

19. The method according to claim 18, wherein the step of patterning the material that will form the target region includes using a hard mask.

20. The method according to claim 17, wherein the material that will form the migration region is a deposited layer.

21. The method according to claim 1, wherein step a) includes:
   providing the substrate;
   applying material that will form the target region;
   patterning the material that will form the target region;
   applying material that will form the migration region; and
   performing a planarization step to produce the target region (8) and the migration region.

22. The method according to claim 21, wherein the step of applying the material that will form the target region includes depositing a layer of the material that will form the target region.

23. The method according to claim 22, wherein the step of patterning the material that will form the target region includes using a hard mask.

24. The method according to claim 21, wherein the planarization step is a CMP step.

25. The method according to claim 1, which comprises repeating steps b) and c) to produce a patterned layer of a predetermined thickness.

* * * * *